(12) United States Patent
Lei et al.

(10) Patent No.: US 11,572,859 B2
(45) Date of Patent: Feb. 7, 2023

(54) IGNITION OVERCURRENT PROTECTION DEVICE, STARTING POWER EQUIPMENT AND IGNITION OVERCURRENT PROTECTION METHOD

(71) Applicant: Shenzhen Carku Technology Co., Limited, Guangdong (CN)

(72) Inventors: Yun Lei, Guangdong (CN); Zhifeng Zhang, Guangdong (CN); Mingxing Ouyang, Guangdong (CN)

(73) Assignee: Shenzhen Carku Technology Co., Limited, Shenzhen (CN)

( * ) Notice: Subject to any disclaimer, the term of this patent is extended or adjusted under 35 U.S.C. 154(b) by 2 days.

(21) Appl. No.: 17/185,195

(22) Filed: Feb. 25, 2021

(65) Prior Publication Data

US 2022/0056877 A1 Feb. 24, 2022

Related U.S. Application Data

(63) Continuation of application No. PCT/CN2020/110303, filed on Aug. 20, 2020.

(51) Int. Cl.
*H02H 3/093* (2006.01)
*F02P 3/055* (2006.01)
(Continued)

(52) U.S. Cl.
CPC .............. *F02P 3/055* (2013.01); *F02N 11/08* (2013.01); *F02P 3/0442* (2013.01); *H03K 17/0828* (2013.01); *H02H 3/093* (2013.01)

(58) Field of Classification Search
CPC ......... B60R 16/03; H02H 3/093; F02P 3/055; F02P 3/0442; F02N 11/08; H03K 17/0828
See application file for complete search history.

(56) References Cited

U.S. PATENT DOCUMENTS 5,239,253 A * 8/1993 Shimizu ............... H02H 3/093
322/90
7,312,969 B2 * 12/2007 Matsumoto ........... H01F 7/1844
361/87
(Continued)

FOREIGN PATENT DOCUMENTS

CN 103321814 A 9/2013
CN 203522157 U 4/2014
(Continued)

OTHER PUBLICATIONS

The Extended European Search Report issued in corresponding EP Application No. CA3111817, dated Jul. 30, 2021.
(Continued)

*Primary Examiner* — Gonzalo Laguarda
(74) *Attorney, Agent, or Firm* — Hauptman Ham, LLP

(57) ABSTRACT

This present disclosure discloses an ignition overcurrent protection device, which includes a switch, a current detection circuit, and a controller. The switch is electrically coupled between a starting power and a power-on connector; the power-on connector is configured for connecting to the automotive power. The current detection circuit is configured for detecting a current value flowing between the starting power and the power-on connector. The controller is coupled to the switch and the current detection circuit. The controller is configured to determine a current range where the current value is located, and determine a preset time threshold corresponding to the current range, and control the switch to be turned off when a duration of the current value reaches the preset time threshold. The present disclosure also provides a starting power equipment and ignition overcurrent protection.

17 Claims, 4 Drawing Sheets

(51) Int. Cl.
  *F02P 3/04* (2006.01)
  *H03K 17/082* (2006.01)
  *F02N 11/08* (2006.01)

(56) References Cited

U.S. PATENT DOCUMENTS

2007/0252559 A1* 11/2007 Uhl .................. H02J 7/1423
                                                  320/166
2014/0077755 A1   3/2014 Zhang et al.
2017/0187179 A1*  6/2017 Morimoto .............. H02H 3/093
2017/0279261 A1*  9/2017 Riley .................. H02H 3/08
2018/0006478 A1   1/2018 Lei

FOREIGN PATENT DOCUMENTS

| CN | 106329692 A | 1/2017 |
|----|-------------|--------|
| CN | 106515624 A | 3/2017 |
| CN | 206180599 U | 5/2017 |
| CN | 108923533 A | 11/2018 |
| CN | 109962451 A | 7/2019 |
| CN | 110857086 A | 3/2020 |
| EP | 2509092 B1 | 8/2015 |

OTHER PUBLICATIONS

The First Office Action issued in corresponding CA Application No. EP20853594.8, dated Dec. 8, 2021.
The First Office Action issued in corresponding CN Application No. CN202080010534.6, dated Feb. 18, 2022.
The International Search Report issued in corresponding International Application No. PCT/CN2020/110303, dated May 19, 2021, pp. 1-4, Beijing, China.

* cited by examiner

IGNITION OVERCURRENT PROTECTION DEVICE, STARTING POWER EQUIPMENT AND IGNITION OVERCURRENT PROTECTION METHOD

CROSS-REFERENCE TO RELATED APPLICATION(S)

This application is a continuation of PCT application No. PCT/CN2020/110303, filed Aug. 20, 2020, the disclosure of which is hereby incorporated by reference in its entirety.

TECHNICAL FIELD

The present disclosure relates to a field of electric energy supply, and in particular to an ignition overcurrent protection device, a starting power equipment and an ignition overcurrent protection method.

BACKGROUND

Currently, an automotive is often equipped with an emergency starting power, which can be used to restart a fire through the emergency starting power after an abnormality causes a flameout. However, when the emergency starting power is fired and restarted, various situations, such as a short circuit, etc, may occur due to different user operations or a connection between the emergency starting power and an automotive power (such as an automotive battery), which may cause the automotive to fail to start normally, or may cause damage to the starting power itself.

SUMMARY

In view of this, the embodiments of the present disclosure provide an ignition overcurrent protection device, a starting power equipment, and an ignition overcurrent protection method, which can enable the automotive to be fired and started normally, and can perform overcurrent protection, and can prevent damage to the starting power.

On one hand, the embodiments of the present disclosure provide an ignition overcurrent protection device. The ignition overcurrent protection device includes a switch, a current detection circuit, and a controller. The switch is electrically coupled between a starting power and a power-on connector. The power-on connector is configured to connect to an automobile power supply. The current detection circuit is electrically coupled between the starting power and the power-on connector, and is configured to detect a current value flowing between the starting power and the power-on connector. The controller is coupled to the switch and the current detection circuit. The controller is configured to determine a current range where the current value is located, and determine a preset time threshold corresponding to the current range, and control the switch to be turned off when a duration of the current value reaches the preset time threshold.

On the other hand, the embodiments of the present disclosure provide a starting power equipment. The starting power equipment includes a starting power, a power-on connector, and an ignition overcurrent protection device. The ignition overcurrent protection device includes a switch, a current detection circuit, and a controller. The switch is electrically coupled between the starting power and the power-on connector. The power-on connector is configured to connect to an automobile power supply. The current detection circuit is electrically coupled between the starting power and the power-on connector, and is configured to detect a current value flowing between the starting power and the power-on connector. The controller is coupled between the switch and the current detection circuit. The controller is configured to determine a current range where the current value is located, and determine a preset time threshold corresponding to the current range, and control the switch to be turned off when a duration of the current value reaches the preset time threshold.

In another aspect, the embodiments of the present disclosure provide an ignition overcurrent protection method. The method includes following steps. A current value flowing between a starting power and a power-on connector is detected through a current detection circuit. A current range where the current value is located is determined. A preset time threshold corresponding to the current range is determined. The switch is controlled to be turned off when a duration of the current value reaches the preset time threshold.

It can be seen that, in the embodiments of the present disclosure, the preset time threshold for overcurrent protection is determined by the current value. Different overcurrent protection trigger times can be set according to differences in current during an ignition start process. Therefore, it can be ensured that the automobile can be fired and started when there is no abnormality, and the overcurrent protection is effectively performed when there is an abnormality.

BRIEF DESCRIPTION OF THE ACCOMPANYING DRAWINGS

In order to more clearly describe the technical solutions in the embodiments of the present disclosure or the prior art, the following will briefly introduce the drawings that need to be used in the description of the embodiments or the prior art. Obviously, the drawings in the following description are only some embodiments of the present disclosure. For those of ordinary skill in the art, other drawings can be obtained based on these drawings without creative work.

DETAILED DESCRIPTION OF ILLUSTRATED EMBODIMENTS

In order to enable those skilled in the art to better understand the solutions of the present disclosure, the technical solutions in the embodiments of the present disclosure will be clearly and completely described below with reference to the drawings in the embodiments of the present disclosure. Obviously, the described embodiments are only a part of the embodiments of the present disclosure, but not all the embodiments. All other embodiments obtained by those of ordinary skill in the art based on the embodiments in this present disclosure without creative work shall fall within a protection scope of the present disclosure.

The terms "first", "second", etc. in the specification and claims of the present disclosure and the above-mentioned drawings are used to distinguish different objects, rather than to describe a specific sequence. In addition, the terms "including" and "having" and any variations thereof are intended to cover a non-exclusive inclusion. For example, a process, method, system, product, or device that includes a series of steps or modules is not limited to the listed steps or modules, but optionally includes unlisted steps or modules, or also includes other steps or modules inherent to these processes, methods, products or equipment optionally.

The "embodiments" herein means that a specific feature, a structure, or a characteristic described in conjunction with the embodiments may be included in at least one embodiment of the present disclosure. The appearance of the phrase in various places in the specification does not necessarily refer to the same embodiment, nor is it an independent or alternative embodiment mutually exclusive with other embodiments. Those skilled in the art clearly and implicitly understand that the embodiments described herein can be combined with other embodiments.

Figure 1:
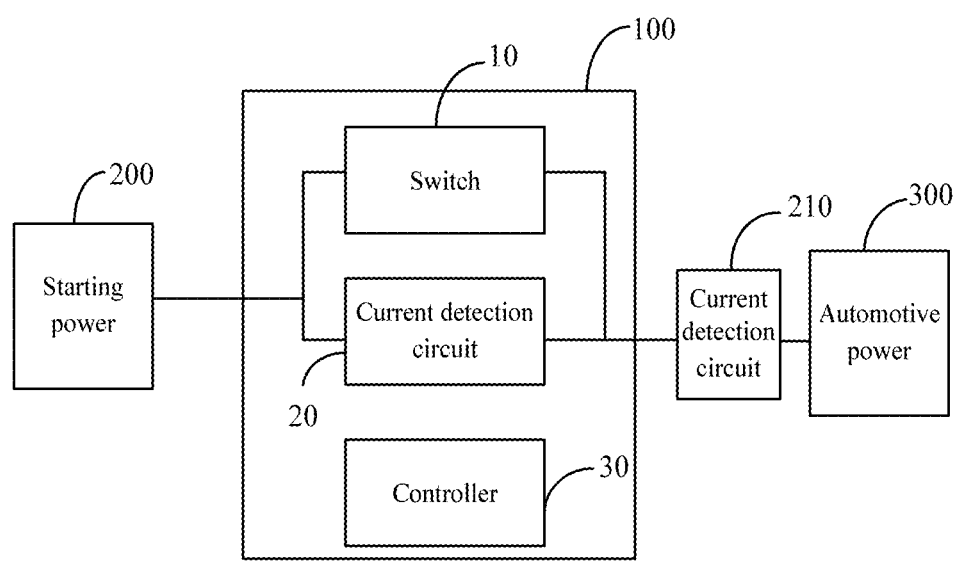
FIG. 1 is a structural block diagram of an ignition overcurrent protection device in an embodiment of the present disclosure.

Please referring to FIG. 1, a structural block diagram of an ignition overcurrent protection device 100 in an embodiment of the present disclosure is illustrated. As shown in FIG. 1, the ignition overcurrent protection device 100 includes a switch 10, a current detection circuit 20, and a controller 30.

The switch 10 is electrically coupled between a starting power 200 and a power-on connector 210. The power-on connector 210 is configured to connect to an automotive power 300. The current detection circuit 20 is electrically coupled to the starting power 200 and the power-on connector 210. The current detection circuit 20 is configured to detect a current value flowing between the starting power 200 and the power-on connector 210. The controller 30 is electrically coupled to the switch 10 and the current detection circuit 20. The controller 30 is configured to determine a current range where the current value is located, determine a preset time threshold corresponding to the current range, and control the switch 10 to be turned off when a duration of the current value reaches the preset time threshold.

Therefore, in this present disclosure, the preset time threshold for overcurrent protection is determined by the current value, and different overcurrent protection trigger times can be set according to differences in current during an ignition start process. Therefore, it can be ensured that the automobile can be fired and started when there is no abnormality, and the overcurrent protection is effectively performed when there is an abnormality.

The current value may be a value of the current flowing in a current loop after the starting power 200 forms the current loop with the automotive power 300 through the power-on connector 210.

A length of the preset time threshold is inversely proportional to a current magnitude of the current range.

That is, in this present disclosure, a plurality of current ranges may be preset, and the plurality of current ranges may correspond to different current levels, and the length of the preset time threshold is inversely proportional to the current level of the current range. That is, the larger the current level of the current range, the shorter the corresponding preset time threshold, when a duration of the current value reaches a shorter preset time threshold, the overcurrent protection will be triggered. However, the smaller the current level of the current range, the longer the corresponding preset time threshold, and when the duration of the current value reaches a longer preset time threshold, the overcurrent protection will be triggered.

Specifically, in this embodiment, the current range includes a first current range, a second current range, and a third current range. The current value in the third current range is all greater than the current value in the second current range. The current value in the second current range is all greater than the current value in the first current range. The preset time threshold includes a first preset time threshold, a second preset time threshold, and a third preset time threshold. The first preset time threshold, the second preset time threshold, and the third preset time threshold correspond to the first current range, the second current range and the third current range respectively. The first preset time threshold is greater than the second preset time threshold, and the second preset time threshold is greater than the third preset time threshold.

The first current range is a range greater than zero and less than or equal to a first preset current value. The second current range is a range greater than the first preset current value and less than or equal to a second preset current value. The third current range is a range greater than the second preset current value and less than or equal to a third preset current value. The first preset current value is less than the second preset current value. The second preset current value is less than the third preset current value.

Therefore, when the controller 30 determines that the current value detected by the current detection circuit 20 belongs to the first current range, it determines that the corresponding preset time threshold is the first preset time threshold. When a duration of the current value reaches the first preset time threshold, the switch 10 is controlled to be turned off for overcurrent protection. At this time, effective protection can be provided for an operation scenario where the user continues to press an automotive starting button or twist a key to try to start the automotive when the automotive cannot be started.

When the controller 30 determines that the current value detected by the current detection circuit 20 belongs to the second current range, it determines that the corresponding preset time threshold is the second preset time threshold. When a duration of the current value reaches the second preset time threshold, the switch 10 is controlled to be turned off for overcurrent protection. At this time, when the starting power supply 200 is a small battery cell and the automobile to be started is a large-displacement automobile, possible scenarios in which the electric energy required by the automobile to be started exceeds a supply capacity of the battery cell of the starting power supply 200 are effectively protected.

When the controller 30 determines that the current value detected by the current detection circuit 20 belongs to the third current range, it determines that the corresponding preset time threshold is the third preset time threshold. When a duration of the current value reaches the third preset time threshold, the switch 10 is controlled to be turned off for overcurrent protection. At this time, if an external load is short-circuited, it can be quickly protected.

As described above, in this embodiment, the plurality of current ranges are a plurality of current ranges that do not have a same current value with each other and its current values are continuous. Obviously, in other embodiments, the current values between the plurality of current ranges may also be discontinuous. For example, in two adjacent current ranges, there is a difference between a maximum current value in the current ranges corresponding to a smaller current level and a minimum current value in the current ranges corresponding to a larger current level. In other embodiments, at least one current range may have a same current value as other current range, that is, the plurality of current ranges may partially overlap.

In this embodiment, the first preset current value is a value between 50-3000 A (amperes), the second preset current value is value between 200-4000 A, and the third preset current value is a value between 500-5000 A. The first preset time threshold is a value between 100-10000 ms (milliseconds), the second preset time threshold is a value between 4-500 ms, and the third preset time threshold is a value between 1-50 ms.

That is, in this present disclosure, the value of the first preset current value may be a value between 50-3000 A. The value of the second preset current value may be a value between 200-4000 A. The value of the third preset current value may be a value between 500-5000 A. The value of the first preset time threshold may be a value between 100-10000 mS (milliseconds). The value of the second preset time threshold may be a value between 4-500 ms. The value of the third preset time threshold may be a value between 1-50 ms.

In this present disclosure, the first preset current value, the second preset current value, the third preset current value, the first preset time threshold, the second preset time threshold, and the third preset time threshold can be preset according to allowable values of the above-mentioned first preset current value, the second preset current value, the third preset current value, the first preset time threshold, the second preset time threshold, and the third preset time threshold, so as to set the plurality of current ranges. The one-to-one correspondence between the plurality of current ranges and the plurality of preset time thresholds can be preset.

Obviously, in this present disclosure, if it is satisfied that the plurality of current ranges are a plurality of current ranges that do not have a same current value with each other and its current values are continuous, then, when the first preset current value, the second preset current value, and the third preset current value are selected in advance, each preset current value is selected based on its allowable value and other preset current values. For example, if the first preset current value is selected to be 500 A first, since the second preset current value must be greater than the first preset current value, the second preset current value is based on its originally allowed value and the first preset current value, the value that can be selected is limited to a value greater than 500 A and less than or equal to 4000 A; further, if the second preset current value is selected as 2000 A, the third preset current value is limited to a value greater than 2000 A and less than or equal to 5000 A.

Therefore, each preset current value is selected according to its allowable value and the value of other preset current values that have been selected simultaneously, and finally the plurality of current ranges that do not have a same current value with each other and its current values are continuous are obtained.

In the present disclosure, the controller 30 determines the preset time threshold corresponding to the current range where the currently detected current value is located according to the correspondence.

In some embodiments, the correspondence may be preset and stored/burned in the controller 30. In other embodiments, the ignition overcurrent protection device 100 may further include a memory (not shown in the figure), and the correspondence between the plurality of current ranges and the plurality of preset time thresholds may be stored in the memory. The controller 30 can read the correspondence from the memory, and determine the preset time threshold corresponding to the current range where the currently detected current value is located according to the correspondence.

Figure 2:
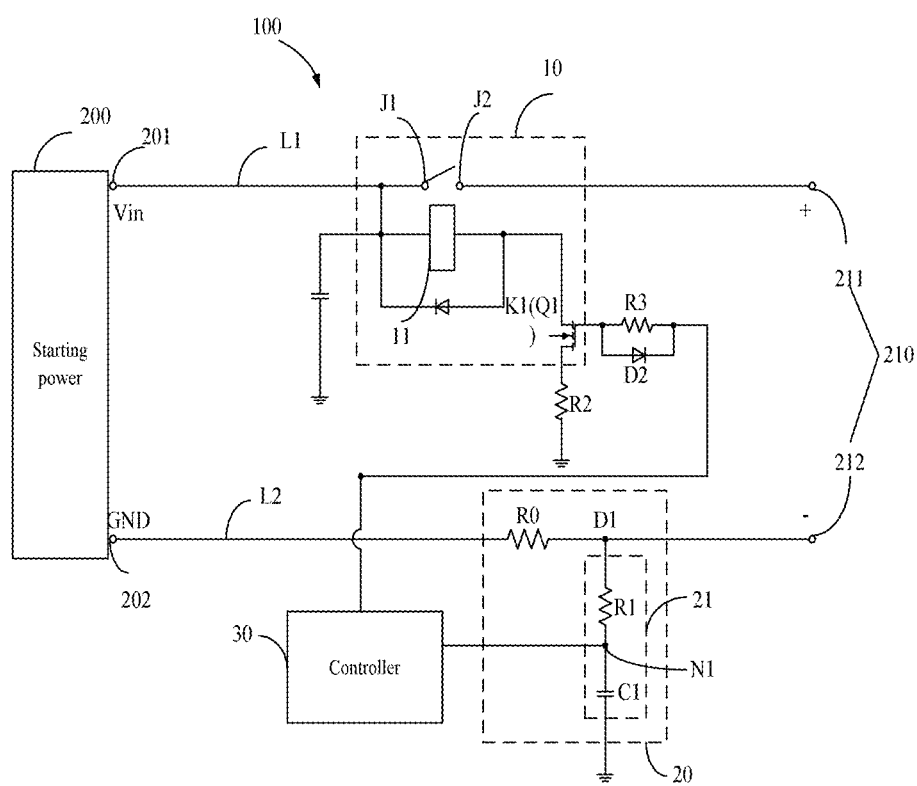
FIG. 2 is a specific circuit diagram of the ignition overcurrent protection device in an embodiment of the present disclosure.

Please referring to FIG. 2, a specific circuit diagram of the ignition overcurrent protection device 100 in an embodiment of the present disclosure is illustrated. As shown in FIG. 2, the switch 10 is coupled between a positive electrode 201 of the starting power 200 and a positive electrode 211 of the power-on connector 210. The current detection circuit 20 is coupled between a negative electrode 202 of the starting power 200 and a negative electrode 212 of the power-on connector 210. When the power-on connector 210 is coupled to the automotive power 300, the starting power 200 and the automotive power 300 form a current loop. The current detection circuit 20 detects a current value in the current loop. The controller 30 controls the switch 10 to be turned off when a duration of the current value reaches the preset time threshold, thereby turning off a connection between the positive electrode 201 of the starting power 200 and the positive electrode 211 of the power-on connector 210, and cutting off the current loop between the starting power 200 and the automobile power supply 300, to realize protection. The positive electrode 201 of the starting power 200 outputs a supply voltage Vin. The negative electrode 202 of the starting power 200 is a ground electrode GND, and the voltage is zero.

The switch 10 is an overcurrent protection switch, and may include one or more of a relay switch, a switching transistor, and a fuse.

As shown in FIG. 2, in this embodiment, the switch 10 is described by taking a relay switch as an example. The switch 10 includes a first contact point J1 and a second contact point J2 electrically coupled to the positive electrode 201 of the starting power 200 and the positive electrode 211 of the power-on connector 210, respectively, and an iron core 11 wound with a conductive coil. One end of the conductive coil is electrically coupled to the positive electrode 201 of the starting power 200, and the other end is grounded through a grounding switch K1.

The switch 10 is a normally open relay. When the grounding switch K1 is turned off, no current flows in the conductive coil, and the first contact point J1 and the second contact point J2 remain to be turned off. When the grounding switch K1 is turned on, the current path of the conductive coil is turned on, and the current flows from the positive electrode 201 of the starting power 200 through the conductive coil, and then passes through the conducted grounding switch K1 to the ground. At this time, the first contact point J1 and the second contact point J2 are turned on, which makes the positive electrode 201 of the starting power 200 to be electrically coupled to the positive electrode 211 of the power-on connector 210, thereby powering the automotive power 300 through the power-on connector 210.

The controller 30 is coupled to the grounding switch K1, and is used to control the grounding switch K1 to be turned on or off. Specifically, in a default state, the controller 30 controls the grounding switch K1 to be turned off, so that no current flows through the conductive coil, and the first contact point J1 and the second contact point J2 remain to be turned off. When the starting power 200 needs to be used to ignite the automobile, the controller 30 controls the grounding switch K1 to be turned on. At this time, the current path of the conductive coil is turned on and current flows from the positive electrode 201 of the starting power 200 through the conductive coil, and then passes through the conducted grounding switch K1 to ground. At this time, the first contact point J1 and the second contact point J2 are turned on, so that the positive electrode 201 of the starting power 200 and the positive electrode 211 of the power-on connector 210 are electrically coupled, thereby powering the automobile power 300 through the power-on connector 210.

When the controller 30 determines that a duration of supplying power to the automotive power 300 with the current value reaches the preset time threshold, it controls the grounding switch K1 to be turned off again. Therefore, no current flows in the conductive coil, the first contact point J1 and the second contact point J2 remain to be turned off, that is, at this time, the switch 10 is controlled to be turned off, so as to perform overcurrent protection.

The first contact point J1 and the second contact point J2 are located in the conductive line L1 between the positive electrode 201 of the starting power 200 and the positive electrode 211 of the power-on connector 210. The conductive line L1 is actually divided into two sections through the first contact point J1 and the second contact point J2. When the first contact point J1 and the second contact point J2 are turned off, the conductive line L1 is equivalent to being cut off, so that the electrical connection between the positive electrode 201 of the starting power 200 and the positive electrode 211 of the power-on connector 210 is cutting off. When the first contact point J1 and the second contact point J2 are turned on, the conductive line L1 forms a complete conductive line, so that the positive electrode 201 of the starting power 200 and the positive electrode 211 of the power-on connector 210 are electrically coupled.

In some embodiments, the switch 10 may be, but is not limited to, a switching transistor, such as a MOS transistor. A drain and a source of the MOS transistor are respectively coupled to the positive electrode 201 of the starting power 200 and the positive electrode 211 of the power-on connector 210. A gate is electrically coupled to the controller 30. The controller 30 can control the MOS transistor to be turned on by outputting one of a high-level signal and a low-level signal, and control the MOS transistor to be turned off by outputting the other of the high-level signal and the low-level signal. The switching transistors include triodes, MOS transistors, IGBT transistors and so on.

As shown in FIG. 2, the current detection circuit 20 includes a detection resistor R0 and a voltage detection circuit 21. The detection resistor RO is coupled between the negative electrode 202 of the starting power 200 and the negative electrode 212 of the power-on connector 210. One end of the voltage detection circuit 21 is coupled to a voltage detection point D1 located between the detection resistor RO and the negative electrode 212 of the power-on connector 210. The other end of the voltage detection circuit 21 is coupled to the controller 30. The controller 30 obtains the voltage of the voltage detection point D1 through the voltage detection circuit 21, and calculates the current value between the starting power 200 and the power-on connector 210 according to the voltage and the resistance of the detection resistor R0.

The detection resistor R0 can be located in the conductive line L2 between the negative electrode 202 of the starting power 200 and the negative electrode 212 of the power-on connector 210. A resistance value of the detection resistor R0 can be significantly greater than a resistance value of the conductive line L2. Therefore, the resistance value of the conductive line L2 can be ignored. The negative electrode 202 of the starting power 200 is a ground electrode GND, and its voltage is zero. Therefore, the voltage of the voltage detection point D1 is a voltage difference between the voltage detection point D1 and the negative electrode 202 of the starting power 200, that is, it is also the voltage difference between the two ends of the detection resistor R0. Therefore, the current value between the starting power 200 and the power-on connector 210 is calculated according to the voltage of the voltage detection point D1 and the resistance value of the detection resistor R0. That is, in some embodiments, the aforementioned current detection circuit 20 detects the current value flowing between the starting power 200 and the power-on connector 210. More precisely, the controller 30 detects the current value flowing between the starting power 200 and power-on connector 210 through the current detection circuit 20. That is, the current value is calculated by obtaining the resistance value of the detection resistor R0 of the current detection circuit 20 and obtaining the voltage of the voltage detection point D1 by the current detection circuit 20.

Obviously, in other embodiments, the current detection circuit 20 may also use other current detectors to directly detect and obtain the current value. The controller 30 can obtain the current value directly detected by the current detection circuit 20.

The resistance value of the detection resistor R0 is a known value. For example, when the detection resistor R0 is installed, a detection resistor RO with a specific resistance value can be selected, and the resistance value of the detection resistor 20 can be stored/programmed in the controller 30 in advance.

As shown in FIG. 2, the voltage detection circuit 21 includes a first resistor R1 and a first capacitor C1 coupled in series between the voltage detection point D1 and the ground. A connection node N1 of the first resistor R1 and the first capacitor C1 is coupled to the controller 30. The controller 30 and the voltage detection point D1 form a virtual short connection through the voltage detection circuit 21. The voltage obtained by the controller 30 is equal to a voltage of the voltage detection point D1.

As shown in FIG. 2, the aforementioned grounding switch K1 is also grounded through a resistor R2. The grounding switch K1 may be an NMOS transistor Q1. A source of the NMOS transistor Q1 is grounded through the resistor R2. A drain of the NMOS transistor Q1 is coupled to the conductive coil. A gate of the NMOS transistor Q1 is electrically coupled to the controller 30.

In the default state, a low-level signal is controlled to be output by the controller 30 to the gate of the NMOS transistor Q1, to control the NMOS transistor Q1 to be turned off, so that no current flows through the conductive coil, and the first contact point J1 and the second contact point J2 maintains to be turned off. When the starting power 200 needs to be used to ignite the automobile, a high level signal is controlled to be output by the controller 30 to the gate of the NMOS transistor Q1, to control the NMOS transistor Q1 to be turned on, at this time, the current path of the conductive coil is turned on and current flows from the positive electrode 201 of the starting power 200 through the conductive coil, and then passes through the conducted grounding switch K1 to the ground. At this time, the first contact point J1 and the second contact point J2 are turned on, which makes the positive electrode 201 of the starting power 200 to be electrically coupled to the positive electrode 211 of the power-on connector 210, thereby powering the automotive power 300 through the power-on connector 210.

When the controller 30 determines that a duration of powering the automotive power 300 with the current value reaches the preset time threshold, a low-level signal is controlled to be output to the gate of the NMOS transistor Q1 again, to control the NMOS transistor Q1 to be turned off, so that no current flows through the conductive coil, and the first contact point J1 and the second contact point J2 remain to be turned off, that is, at this time, the switch 10 is controlled to be turned off, to perform overcurrent protection.

In some embodiments, as shown in FIG. 2, a resistor R3 and a diode D2 are also coupled between the controller 30 and the grounding switch K1. The resistor R3 and the diode D2 are coupled in parallel between the controller 30 and the grounding switch K1. The parallel resistor R3 and diode D2 are used to achieve a certain voltage isolation function.

The power-on connector 210 can be a conductive clip. The automotive power 300 can be an automobile battery. The positive electrode 211 and the negative electrode 212 of the power-on connector 210 are a positive electrode conductive clip and a negative electrode conductive clip respectively, and can be clipped in the positive electrode and negative electrode of the automobile battery respectively, thereby supplying power to the automobile battery, to realize power-on and ignition.

As shown in FIG. 2, the ignition overcurrent protection device 100 may also include other circuit elements, which are not described in detail because they are not related to the main principles of this present disclosure or are relatively well-known.

Figure 3:
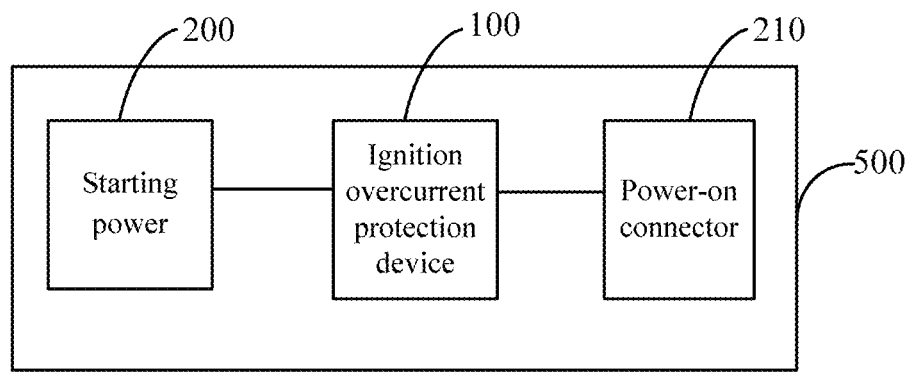
FIG. 3 is a structural block diagram of a starting power equipment in an embodiment of the present disclosure.

As shown in FIG. 3, a structural block diagram of a starting power equipment 500 is illustrated. As shown in FIG. 3, the starting power equipment 500 may include the aforementioned ignition overcurrent protection device 100, the starting power 200, and the power-on connector 210. The ignition overcurrent protection device 100 is located between the starting power 200 and the power-on connector 210. That is, this present disclosure also provides the starting power equipment 500 with the aforementioned ignition overcurrent protection device 100, so that the starting power equipment 500 has an ignition overcurrent protection function.

In some embodiments, the present disclosure may also provide an automobile with the starting power equipment 500, that is, the starting power equipment 500 with the ignition overcurrent protection device 100. The starting power 200 and the power-on connector 210 can be installed in the automobile, thus, start and ignition are performed when needed.

Obviously, the starting power equipment 500 may also be equipment independent of the automobile.

Figure 4:
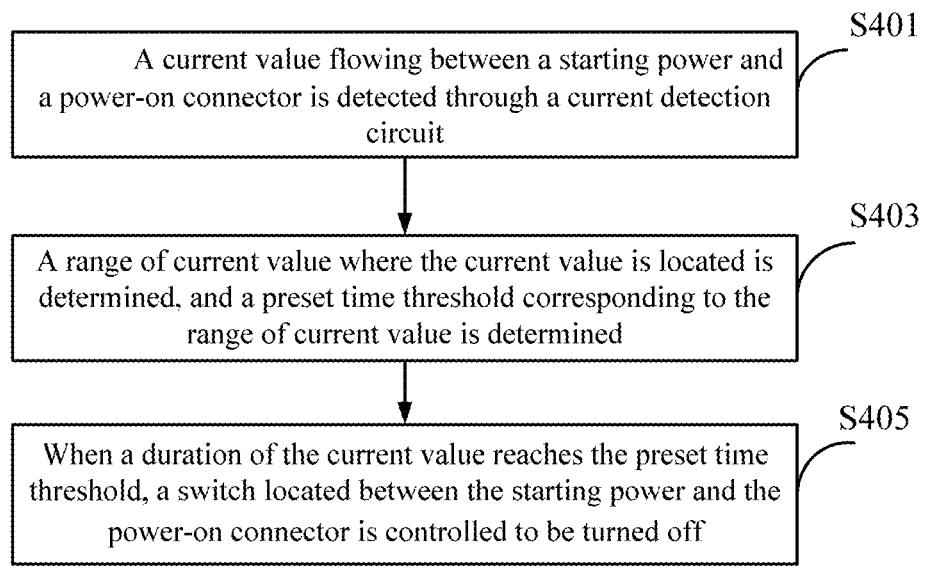
FIG. 4 is a flowchart of an ignition overcurrent protection method in an embodiment of the present disclosure.

Please referring to FIG. 4, a flowchart of an ignition overcurrent protection method in one embodiment of this present disclosure is illustrated. The ignition overcurrent protection method can be applied to the aforementioned ignition overcurrent protection device 100. As shown in FIG. 4, the method includes the following steps.

S401: A current value flowing between a starting power 200 and a power-on connector 210 is detected through a current detection circuit 20.

S403: A current range where the current value is located is determined, and a preset time threshold corresponding to the current range is determined.

S405: When a duration of the current value reaches the preset time threshold, a switch 10 located between the starting power 200 and the power-on connector 210 is controlled to be turned off.

A length of the preset time threshold is inversely proportional to a current magnitude of the current range. As mentioned above, a plurality of current ranges can correspond to different current levels, and the length of the preset time threshold is inversely proportional to the current magnitude of the current range, specifically: the length of the preset time threshold is inversely proportional to the current level of the current range. That is, the larger the current level of the current range, the shorter the corresponding preset time threshold, when a duration of the current value reaches a shorter preset time threshold, the overcurrent protection will be triggered. However, the smaller the current level of the current range, the longer the corresponding preset time threshold, and when the duration of the current value reaches a longer preset time threshold, the overcurrent protection will be triggered.

In some embodiments, the current range includes a first current range, a second current range, and a third current range. The preset time threshold includes a first preset time threshold, a second preset time threshold, and a third preset time threshold. The current range where the current value is located is determined, and a preset time threshold corresponding to the current range is determined, includes: when the current value is determined to be located in the first current range, the corresponding preset time threshold is determined to be the first preset time threshold; when the current value is determined to be located in the second current range, the corresponding preset time threshold is determined to be the second preset time threshold; and when the current value is determined to be located in the third current range, the corresponding preset time threshold is determined to be the third preset time threshold. The current value in the third current range is greater than the current value in the second current range, and the current value in the second current range is greater than the current value in the first current range. The first preset time threshold is greater than the second preset time threshold, and the second preset time threshold is greater than the third preset time threshold.

In this embodiment, the first current range is a range greater than zero and less than or equal to a first preset current value; the second current range is greater than the first preset current value and less than or equal to a second preset current value; the third current range is a range greater than the second preset current value and less than or equal to a third preset current value; the first preset current value is less than the second preset current value; the second preset current value is less than the third preset current value.

The first preset current value is a value between 50-3000 A, the second preset current value is a value between 200-4000 A, and the third preset current value is a value between 500-5000 A. The first preset time threshold is a value between 100-10000 ms, the second preset time threshold is a value between 4-500 ms, and the third preset time threshold is a value between 1-50 ms.

The current detection circuit 20 includes a detection resistor R0 and a voltage detection circuit 21. The detection resistor R0 is coupled between a negative electrode 202 of the starting power 200 and a negative electrode 212 of the power-on connector 210. One end of the voltage detection circuit 21 is coupled to a voltage detection point D1 between the detection resistor R0 and the negative electrode 212 of the power-on connector 210. The other end of the voltage detection circuit 21 is coupled to the controller 30. The current flowing the starting power 200 and the power-on connector 210 is detected through the current detection circuit 20, includes: the voltage of the voltage detection point D1 is obtained through the voltage detection circuit 21; and the current value between the starting power 200 and the power-on connector 210 is calculated according to the voltage and the resistance value of the detection resistor R0.

Therefore, the present disclosure also provides an ignition overcurrent protection method. The preset time threshold for overcurrent protection is determined by the current value, and different overcurrent protection trigger times can be set according to the differences in current during an ignition start process. Therefore, it can be ensured that the automobile can be fired and started when there is no abnormality, and the overcurrent protection is effectively performed when there is an abnormality.

The ignition overcurrent protection method corresponds to a function of the aforementioned ignition overcurrent protection device 100, and can be referred to each other where necessary. For example, the ignition overcurrent protection method can also refer to a function description of the aforementioned ignition overcurrent protection device 100, and having other steps or more specific implementation steps.

It should be noted that, for the foregoing method embodiments, for the sake of simple description, they are all expressed as a series of action combinations, but those skilled in the art should know that this present disclosure is not limited by the described sequence of actions, because according to this present disclosure, some steps can be performed in other order or simultaneously. Secondly, those skilled in the art should also know that the embodiments described in the specification are all preferred embodiments, and the involved actions and modules are not necessarily required by this present disclosure.

In the above-mentioned embodiments, the description of each embodiment has its own emphasis. For parts that are not described in detail in an embodiment, reference may be made to related descriptions of other embodiments.

The modules described above as separate components may or may not be physically separate, and the components displayed as modules may or may not be physical modules, that is, they may be located in one place, or they may be distributed to multiple network modules. Some or all of the modules may be selected according to actual needs to achieve the objectives of the solutions of the embodiments.

Those of ordinary skill in the art can understand that all or part of the steps in the various methods of the above-mentioned embodiments can be completed by a program instructing relevant hardware. The program can be stored in a computer-readable memory, and the memory can include: a flash disk , Read-Only Memory (abbreviated as: ROM), Random Access Memory (abbreviated as: RAM), magnetic disk or CD, etc.

The embodiments of the present disclosure are described in detail above, and specific examples are used in this article to illustrate the principles and implementation of the present disclosure. The descriptions of the above embodiments are only used to help understand the methods and core ideas of the present disclosure; A person of ordinary skill in the art, based on the idea of the present disclosure, will have changes in the specific implementation and the scope of present disclosure. In summary, the content of the present disclosure should not be construed as a limitation to the present disclosure.

What is claimed is:

1. An ignition overcurrent protection device, wherein the ignition overcurrent protection device comprises:
    a switch, electrically coupled between a starting power and a power-on connector; the power-on connector being configured for connecting to an automotive power;
    a current detection circuit, electrically coupled between the starting power and the power- on connector, and configured for detecting a current value flowing between the starting power and the power-on connector; and
    a controller, electrically coupled to the switch and the current detection circuit; the controller being configured to determine a current range where the current value is located, and determine a preset time threshold corresponding to the current range, and control the switch to be turned off when a duration of the current value reaches the preset time threshold;
    wherein the current range comprises at least two of a first current range, a second current range and a third current range; the preset time threshold comprises a first preset time threshold, a second preset time threshold and a third preset time threshold; the first preset time threshold, the second preset time threshold and the third preset time threshold correspond to the first current range, the second current range and the third current range respectively; and
    wherein the first preset time threshold is configured for protecting overcurrent of an operation scenario where an automotive starting button is continuously pressed or a key is continuously twisted to try to start an automotive when the automotive cannot be started; the second preset time threshold is configured for protecting overcurrent of an operation scenario where electric energy required by an automobile to be started exceeds a supply capacity of a battery cell of the starting power; the third preset time threshold is configured for protecting overcurrent of an operation scenario where an external load is short-circuited.

2. The ignition overcurrent protection device according to claim 1, wherein a length of the preset time threshold is inversely proportional to a current magnitude of the current range.

3. The ignition overcurrent protection device according to claim 2, wherein the current value in the third current range is greater than the current value in the second current range; the current value in the second current range is greater than the current value in the first current range; the first preset time threshold is greater than the second preset time threshold; and the second preset time threshold is greater than the third preset time threshold.

4. The ignition overcurrent protection device according to claim 3, wherein the first current range is a range greater than zero and less than or equal to a first preset current value; the second current range is a range greater than the first preset current value and less than or equal to a second preset current value; the third current range is a range greater than the second preset current value and less than or equal to a third preset current value; the first preset current value is less than the second preset current value; and the second preset current value is less than the third preset current value.

5. The ignition overcurrent protection device according to claim 4, wherein the first preset current value is a value between 50-3000A; the second preset current value is a value between 200-4000A; the third preset current value is a value between 500-5000A; the first preset time threshold is a value between 100-10000 mS; the second preset time threshold is a value between 4-500 ms; and the third preset time threshold is a value between 1-50 ms.

6. The ignition overcurrent protection device according to claim 1, wherein the switch is coupled between a positive electrode of the starting power and a positive electrode of the power-on connector; the current detection circuit is coupled between a negative electrode of the starting power and a negative electrode of the power-on connector; when the power-on connector is coupled to the automotive power, the starting power and the automotive power form a current loop; the current detection circuit detects the current value in the current loop; when the duration of the current value reaches the preset time threshold, the controller controls the switch to be turned off, thereby turning off a connection between the positive electrode of the starting power and the positive electrode of the power-on connector, and cutting off the current loop between the starting power and the automotive power.

7. The ignition overcurrent protection device according to claim 6, wherein the switch comprises one or more of a relay switch, a switching transistor, and a fuse.

8. The ignition overcurrent protection device according to claim 6, wherein the current detection circuit comprises a detection resistor and a voltage detection circuit; the detection resistor is coupled between the negative electrode of the starting power and the negative electrode of the power-on connector; one end of the voltage detection circuit is coupled to a voltage detection point between the detection resistor and the negative electrode of the power-on connector, and the other end of the voltage detection circuit is coupled to the controller;
the controller obtains a voltage of the voltage detection point through the voltage detection circuit and calculates the current value between the starting power and the power-on connector according to the voltage and a resistance value of the detection resistor.

9. The ignition overcurrent protection device according to claim 8, wherein the voltage detection circuit comprises a first resistor and a first capacitor coupled in series between the voltage detection point and ground; the first resistor and a connection node of the first capacitor are coupled to the controller; the controller and the voltage detection point form a virtual short connection through the voltage detection circuit; the voltage obtained by the controller is equal to the voltage of the voltage detection point.

10. A starting power equipment, wherein the starting power equipment comprises a starting power, a power-on connector, and an ignition overcurrent protection device according to claim 1.

11. The ignition overcurrent protection device according to claim 1, wherein the switch is an overcurrent protection switch.

12. An ignition overcurrent protection method, wherein the method comprises:
detecting a current value flowing between a starting power and a power-on connector through a current detection circuit;
determining a current range where the current value is located, and determining a preset time threshold corresponding to the current range; and
controlling a switch located between the starting power and the power-on connector to be turned off when a duration of the current value reaches the preset time threshold;
wherein the current range comprises at least two of a first current range, a second current range and a third current range; the preset time threshold comprises a first preset time threshold, a second preset time threshold and a third preset time threshold; the first preset time threshold, the second preset time threshold and the third preset time threshold correspond to the first current range, the second current range and the third current range respectively;
wherein the first preset time threshold is configured for protecting overcurrent of an operation scenario where an automotive starting button is continuously pressed or a key is continuously twisted to try to start an automotive when the automotive cannot be started; the second preset time threshold is configured for protecting overcurrent of an operation scenario where electric energy required by an automobile to be started exceeds a supply capacity of a battery cell of the starting power; the third preset time threshold is configured for protecting overcurrent of an operation scenario where an external load is short-circuited; and
the determining the current range where the current value is located and the determining the preset time threshold corresponding to the current range comprise:
determining the corresponding preset time threshold is the first preset time threshold when the current value is determined to be within the first current range; or
determining the corresponding preset time threshold is the second preset time threshold when the current value is determined to be within the second current range; or
determining the corresponding preset time threshold is the third preset time threshold when the current value is determined to be with the third current range.

13. The method according to claim 12, wherein a length of the preset time threshold is inversely proportional to a current magnitude of the current range.

14. The method according to claim 13,
wherein, the current value in the third current range is greater than the current value in the second current range; the current value in the second current range is greater than the current value in the first current range; the first preset time threshold is greater than the second preset time threshold; the second preset time threshold is greater than the third preset time threshold.

15. The method according to claim 14, wherein the first current range is a range greater than zero and less than or equal to the first preset current value; the second current range is a range greater than the first preset current value and less than or equal to the second preset current value; the third current range is a range greater than the second preset current value and less than or equal to the third preset current value; the first preset current value is less than the second preset current value; the second preset current value is less than the third preset current value.

16. The method according to claim 15, wherein the first preset current value is a value between 50-3000A; the second preset current value is value between 200-4000A; the third preset current value is a value between 500-5000A; the first preset time threshold is a value between 100-10000 ms, the second preset time threshold is a value between 4-500 ms; the third preset time threshold is a value between 1-50 ms.

17. The method according to claim 12, wherein the current detection circuit comprises a detection resistor and a voltage detection circuit, and the detection resistor is coupled to a negative electrode of the starting power and a negative electrode of the power-on connector; one end of the voltage detection circuit is coupled to a voltage detection point located between the detection resistor and the negative electrode of the power-on connector, and the other end of the voltage detection circuit is coupled to the controller, and the current value flowing between the starting power and the power-on connector is detected through a current detection circuit, comprises:

obtaining a voltage of the voltage detection point through the voltage detection circuit; and calculating the current value between the starting power and the power-on connector according to the voltage and a resistance value of the detection resistor.

* * * * *